US012685226B2

(12) United States Patent
Lee et al.

(10) Patent No.: US 12,685,226 B2
(45) Date of Patent: Jul. 14, 2026

(54) SEMICONDUCTOR PACKAGES

(71) Applicant: SAMSUNG ELECTRONICS CO., LTD., Suwon-si (KR)

(72) Inventors: Hyoeun Lee, Suwon-si (KR); Hyunggil Baek, Suwon-si (KR); Su-Chang Lee, Suwon-si (KR); Gyunghwan Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 362 days.

(21) Appl. No.: 18/367,506

(22) Filed: Sep. 13, 2023

(65) Prior Publication Data

US 2024/0290750 A1 Aug. 29, 2024

(30) Foreign Application Priority Data

Feb. 23, 2023 (KR) ........................ 10-2023-0024609

(51) Int. Cl.
H10W 90/00 (2026.01)
H10B 80/00 (2026.01)
(Continued)

(52) U.S. Cl.
CPC ............ H10W 90/00 (2026.01); H10B 80/00 (2023.02); H10W 70/68 (2026.01);
(Continued)

(58) Field of Classification Search
CPC ............ H01L 25/0657; H01L 25/0652; H01L 25/043; H01L 25/071; H01L 25/074;

H01L 25/0756; H01L 25/112; H01L 25/117; H01L 2224/08145; H01L 27/0688; H01L 23/3185; H01L 23/3157; H01L 21/56; H01L 21/563; H01L 21/568; H01L 23/5389; H01L 21/02021; H05K 1/185; H10B 20/40–65; H10B 53/20; H10B 41/20–27; H10B 43/20–27;
(Continued)

(56) References Cited

U.S. PATENT DOCUMENTS 10,056,267 B2 8/2018 Cheng et al.
10,418,315 B2 * 9/2019 Kawaminami ....... H10W 70/65
(Continued)

*Primary Examiner* — Wael M Fahmy
*Assistant Examiner* — Quinton A Brasfield
(74) *Attorney, Agent, or Firm* — MORGAN, LEWIS & BOCKIUS LLP

(57) ABSTRACT

A semiconductor package includes a substrate including a first region having a recess defined therein and a second region spaced apart from the first region. The second region does not include the recess. A three-dimensional (3D) integrated circuit structure is on the first region. The 3D integrated circuit structure includes a first semiconductor chip die and a second semiconductor chip die disposed on the first semiconductor chip die. A plurality of connecting members electrically connecting the first semiconductor chip die to the substrate. A first side of each connecting member of the plurality of connecting members directly contacts the first semiconductor chip die and a second side that is opposite to the first side directly contacts the first region. A memory structure is disposed in the second region and positioned side by side with the 3D integrated circuit structure.

20 Claims, 22 Drawing Sheets

(51) Int. Cl.

| | |
|---|---|
| *H10W 70/68* | (2026.01) |
| *H10W 70/685* | (2026.01) |
| *H10W 74/10* | (2026.01) |
| *H10W 74/15* | (2026.01) |
| *H10W 74/47* | (2026.01) |

(52) U.S. Cl.

CPC ........ *H10W 70/685* (2026.01); *H10W 74/111* (2026.01); *H10W 74/47* (2026.01); *H10W 74/15* (2026.01); *H10W 90/722* (2026.01); *H10W 90/724* (2026.01); *H10W 90/732* (2026.01)

(58) Field of Classification Search

CPC ........... H10B 51/20; H10B 63/84–845; H10W 90/10; H10W 90/15; H10W 90/155; H10W 90/723; H10W 90/725; H10W 90/727; H10W 90/729; H10W 90/733; H10W 90/735; H10W 90/737; H10W 90/739; H10W 90/753; H10W 90/755; H10W 90/757; H10W 90/759

See application file for complete search history.

(56) References Cited

U.S. PATENT DOCUMENTS

| | | | | |
|---|---|---|---|---|
| 10,600,706 | B2* | 3/2020 | Lee | H10W 70/614 |
| 11,171,115 | B2 | 11/2021 | Manipatruni et al. | |
| 11,309,246 | B2 | 4/2022 | Dabral et al. | |
| 11,923,257 | B2* | 3/2024 | Starkston | H10W 70/68 |
| 2017/0110469 | A1* | 4/2017 | Yi | H10D 30/6894 |
| 2022/0173072 | A1* | 6/2022 | Hong | H10W 70/635 |
| 2022/0189916 | A1* | 6/2022 | Jung | H10W 70/611 |
| 2022/0336309 | A1* | 10/2022 | Huang | H10W 74/141 |

* cited by examiner

100

110

180

SEMICONDUCTOR PACKAGES

CROSS-REFERENCE TO RELATED APPLICATION

This application claims priority under 35 U.S.C. § 119 to Korean Patent Application No. 10-2023-0024609, filed on Feb. 23, 2023 in the Korean Intellectual Property Office, the disclosure of which is incorporated by reference in its entirety herein.

1. TECHNICAL FIELD

The present disclosure relates to a semiconductor package.

2. DISCUSSION OF RELATED ART

With the advancement of the information technology, there has been an increased market demand for the semiconductor industry to provide a high integration density to integrate a greater number of passive or active devices into a predetermined region. Therefore, there has been an increased interest in packaging methods for providing high integration density. A side-by-side system in package (SIP) for disposing a three-dimensional (3D) integrated circuit structure and a memory structure on a substrate has been developed.

Advantages of the side-by-side system in package as compared to a stackable semiconductor package (e.g., a package on package (PoP)), include an increased dissipation characteristic, the avoidance of a process for forming a back side redistribution structure, and a reduction of a turn-around time (TAT) used in manufacturing the semiconductor package. However, the side-by-side disposition of the 3D integrated circuit structure and the memory structure on the substrate may increase the package size and resultantly generate a warpage.

Therefore, new packages for reducing warping are desired.

SUMMARY

An embodiment may manufacture a system in package in which a 3D integrated circuit structure and a memory structure are disposed side by side on a substrate to solve a dissipation problem of a conventional stackable semiconductor package. However, when the 3D integrated circuit structure and the memory structure are disposed side by side, the package size may be increased and a warpage may be generated to the package.

The present disclosure provides a semiconductor package for disposing a 3D integrated circuit structure on a first region defined by a recess in a substrate, and disposing a memory structure on a second region.

According to an embodiment of the present disclosure, a semiconductor package includes a substrate including a first region having a recess defined therein and a second region spaced apart from the first region. The second region does not include the recess. A three-dimensional (3D) integrated circuit structure is on the first region. The 3D integrated circuit structure includes a first semiconductor chip die and a second semiconductor chip die disposed on the first semiconductor chip die. A plurality of connecting members electrically connecting the first semiconductor chip die to the substrate. A first side of each connecting member of the plurality of connecting members directly contacts the first semiconductor chip die and a second side that is opposite to the first side directly contacts the first region. A memory structure is disposed in the second region and positioned side by side with the 3D integrated circuit structure.

In an embodiment, a difference between a vertical thickness of the second region and a vertical thickness of the first region may be in a range of about 180 um to about 220 um.

In an embodiment, a vertical thickness of the first region may be in a range of about 115 um to about 135 um.

In an embodiment, a vertical thickness of the second region may be in a range of about 315 um to about 335 um.

In an embodiment, a level of an uppermost surface of the second region may be between levels of a lowermost surface of the first semiconductor chip die and an uppermost surface of the first semiconductor chip die.

In an embodiment, the second semiconductor chip die may include a communication chip or a sensor.

In an embodiment, the first semiconductor chip die may include a central processing unit (CPU) or graphics processing unit (GPU).

In an embodiment, the first semiconductor chip die may include a plurality of through silicon vias.

In an embodiment, the 3D integrated circuit structure may include a system on chip (SOC).

In an embodiment, the memory structure may include a high-bandwidth memory (HBM).

According to an embodiment of the present disclosure, a substrate includes a first region having a recess defined therein and a second region spaced apart from the first region. The second region does not include the recess. A redistribution structure is on the first region. A three-dimensional (3D) integrated circuit structure is on the redistribution structure. The 3D integrated circuit structure includes a first semiconductor chip die and a second semiconductor chip die disposed on the first semiconductor chip die. A memory structure is disposed in the second region and positioned side by side with the 3D integrated circuit structure.

In an embodiment, the semiconductor package may further include a molding material on the redistribution structure. The molding material molds the 3D integrated circuit structure.

In an embodiment, the semiconductor package may further include a plurality of connecting members disposed between the redistribution structure and the first region of the substrate. At least one capacitor structure is on a bottom surface of the redistribution structure.

In an embodiment, the semiconductor package may further include an insulating member surrounding the connecting members and the at least one capacitor structure between the first region of the substrate and the redistribution structure.

In an embodiment, the insulating member may include a molded under-fill (MUF).

According to an embodiment of the present disclosure, a substrate includes a first region having a recess defined therein and a second region space apart from the first region. The second region does not include the recess. A 3D integrated circuit structure is on the first region. The 3D integrated circuit structure includes a first semiconductor chip die. A second semiconductor chip die is disposed on the first semiconductor chip die. A plurality of first connecting members is disposed between the first semiconductor chip die and the second semiconductor chip die. The plurality of connecting members electrically connect the first semiconductor chip die to the substrate. An insulating member surrounds the plurality of first connecting members between the first semiconductor chip die and the second semiconductor chip die. The semiconductor package further includes a plurality of second connecting members. A first side of each second connecting member of the plurality of second connecting members directly contacts the first semiconductor chip die and a second side that is opposite to the first side directly contacts the first region. A memory structure is disposed on the second region and is positioned side by side with the 3D integrated circuit structure. A molding material molds the 3D integrated circuit structure and the memory structure.

In an embodiment, each first connecting member of the plurality of first connecting members may include a micro bump.

In an embodiment, the plurality of second connecting members may include a micro bump.

In an embodiment, the insulating member may include a non-conductive film (NCF).

In an embodiment, the molding material may include an epoxy molding compound (EMC).

According to some embodiments of the present disclosure, the semiconductor package with a side-by-side structure in which the 3D integrated circuit structure is disposed on the first region defined by the recess of the substrate, and the memory structure is disposed on the second region is provided, thereby increasing the dissipation characteristic and reducing the warpage applied to the semiconductor package.

BRIEF DESCRIPTION OF THE DRAWINGS

FIG. 3 to FIG. 9 show a method for manufacturing a semiconductor package of FIG. 1 according to embodiments of the present disclosure.

FIG. 4 shows a cross-sectional view of mounting of a first semiconductor chip die on a recess of a substrate as one of steps of a method for manufacturing a semiconductor package according to an embodiment of the present disclosure.

FIG. 5 shows a cross-sectional view of attaching an insulating member on a first semiconductor chip die as one of steps of a method for manufacturing a semiconductor package according to an embodiment of the present disclosure.

FIG. 6 shows a cross-sectional view of mounting a second semiconductor chip die on a first semiconductor chip die through an insulating member as one of steps of a method for manufacturing a semiconductor package according to an embodiment of the present disclosure.

FIG. 7 shows a cross-sectional view of mounting a memory structure on a substrate as one of steps of a method for manufacturing a semiconductor package according to an embodiment of the present disclosure.

FIG. 8 shows a cross-sectional view of molding a memory structure and a 3D integrated circuit structure on a substrate as one of steps of a method for manufacturing a semiconductor package according to an embodiment of the present disclosure.

FIG. 9 shows a cross-sectional view of debonding a carrier from a substrate as one of steps of a method for manufacturing a semiconductor package according to an embodiment of the present disclosure.

FIG. 11 to FIG. 22 show a method for manufacturing a semiconductor package of FIG. 10 according to embodiments of the present disclosure.

FIG. 12 shows a cross-sectional view of bonding a first semiconductor chip die to a front side redistribution structure as one of steps of a method for manufacturing a package including a 3D integrated circuit structure according to an embodiment of the present disclosure.

FIG. 13 shows a cross-sectional view of attaching an insulating member on a first semiconductor chip die as one of steps of a method for manufacturing a package including a 3D integrated circuit structure according to an embodiment of the present disclosure.

FIG. 14 shows a cross-sectional view of bonding a second semiconductor chip die to a first semiconductor chip die through an insulating member as one of steps of a method for manufacturing a package including a 3D integrated circuit structure according to an embodiment of the present disclosure.

FIG. 15 shows a cross-sectional view of molding a 3D integrated circuit structure on a front side redistribution structure as one of steps of a method for manufacturing a package including a 3D integrated circuit structure according to an embodiment of the present disclosure.

FIG. 16 shows a cross-sectional view of planarizing an upper surface of a package including a 3D integrated circuit structure as one of steps of a method for manufacturing a package including a 3D integrated circuit structure according to an embodiment of the present disclosure.

FIG. 17 shows a cross-sectional view of debonding a carrier as one of steps of a method for manufacturing a package including a 3D integrated circuit structure according to an embodiment of the present disclosure.

FIG. 18 shows a cross-sectional view of attaching an connecting member and a passive element to a bottom surface of a package including a 3D integrated circuit structure as one of steps of a method for manufacturing a package including a 3D integrated circuit structure according to an embodiment of the present disclosure.

FIG. 19 shows a cross-sectional view of mounting a package including a 3D integrated circuit structure on a recess of a substrate as one of steps of a method for manufacturing a semiconductor package according to an embodiment of the present disclosure.

FIG. 20 shows a cross-sectional view of surrounding a connecting member and a passive element of a package including a 3D integrated circuit structure by use of an insulating member as one of steps of a method for manufacturing a semiconductor package according to an embodiment of the present disclosure.

FIG. 21 shows a cross-sectional view of mounting a memory structure on a substrate as one of steps of a method for manufacturing a semiconductor package according to an embodiment of the present disclosure.

FIG. 22 shows a cross-sectional view of debonding a carrier as one of steps of a method for manufacturing a semiconductor package according to an embodiment of the present disclosure.

DETAILED DESCRIPTION OF EMBODIMENTS

Figure 1:
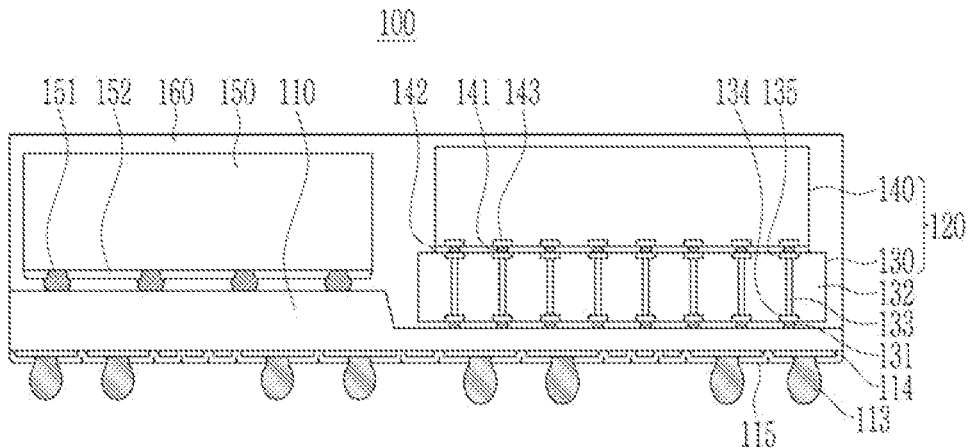
FIG. 1 shows a cross-sectional view of a semiconductor package generated by molding a 3D integrated circuit structure disposed on a recess of a substrate, and a memory structure disposed side by side with the 3D integrated circuit structure by use of a molding material according to an embodiment of the present disclosure.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

The size and thickness of each configuration shown in the drawings are arbitrarily shown for better understanding and ease of description, but the present disclosure is not limited thereto.

Throughout the specification, when it is described that a part is "connected (in contact with, coupled)" to another part, the part may be "directly connected" to the other element or "connected" to the other part through a third part. Unless explicitly described to the contrary, the word "comprise", and variations such as "comprises" or "comprising", will be understood to imply the inclusion of stated elements but not the exclusion of any other elements.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned "on" or "above" the upper side of the object portion based on a gravitational direction.

The phrase "on a plane" means viewing the object portion from the top, and the phrase "on a cross-section" means viewing a cross-section of which the object portion is perpendicularly cut from the side.

A semiconductor device and a method for manufacturing a semiconductor device according to an embodiment will now be described with reference to accompanying drawings.

FIG. 1 shows a cross-sectional view of a semiconductor package 100 generated by molding a three-dimensional (3D) integrated circuit structure 120 disposed on a recess of a substrate 110, and a memory structure 150 disposed side by side with the 3D integrated circuit structure 120 by use of a molding material 160.

Referring to FIG. 1, in an embodiment the semiconductor package 100 may include a substrate 110, a 3D integrated circuit structure 120 including a first semiconductor chip die 130 and a second semiconductor chip die 140, a memory structure 150, and a molding material 160.

The substrate 110 includes a region defined as a recess. In an embodiment shown in FIG. 1, the region defined as a recess is shown to be disposed on a right of the substrate. However, embodiments of the present disclosure are not necessarily limited thereto. For example, in some embodiments the region defined as a recess may be disposed on a left or in a center of the substrate. The region defined as a recess may include a cavity shape. The substrate 110 may include a printed circuit board (PCB).

External connecting members 113, metal pads 114, and insulation layers 115 may be disposed on a bottom surface of the substrate 110. The external connecting members 113 connect the substrate 110 to external devices. In an embodiment, the external connecting member 113 may include at least one compound selected from tin, silver, lead, nickel, copper, and alloys thereof. The metal pads 114 electrically couple the substrate 110 and the external connecting member 113. In an embodiment, the metal pads 114 may include at least one compound selected from copper, nickel, zinc, gold, silver, platinum, palladium, chromium, titanium, and alloys thereof. The insulation layer 115 may include a plurality of openings for soldering. In an embodiment, the insulation layer 115 may include a solder resist. The insulation layer 115 prevents the external connecting member 113 from being short-circuited The 3D integrated circuit structure 120 may include a first semiconductor chip die 130 and a second semiconductor chip die 140. The 3D integrated circuit structure 120 provides the integrated circuit with a 3D single chip, which represents a method for changing a circuit stacking method to a perpendicular type from the existing horizontal type. In an embodiment in which the stacking method in the perpendicular direction is used, more elements may be included in the same silicon wafer area, thereby reducing manufacturing costs and increasing performance. In an embodiment, the 3D integrated circuit structure 120 may include a system on chip (SOC).

In an embodiment, the first semiconductor chip die 130 may include connecting members 131, first semiconductor chips 132, through silicon vias (TSV) 133, lower bonding pads 134, and upper bonding pads 135. In an embodiment, the connecting member 131 electrically couples the first semiconductor chip die 130 to the substrate. For example, a first side (e.g., an upper side) of the connecting member 131 directly contacts the first semiconductor chip die 130, and a second side (e.g., a lower side) that is an opposite side to the first side directly contacts a first region 111 (FIG. 2) of the substrate 110. The first region 111 of the substrate 110 may have the recess defined therein. The second region 112 of the substrate 110 may not include the recess. In an embodiment, the connecting member 131 may include a micro bump. In an embodiment, the connecting member 131 may include at least one compound selected from tin, silver, lead, nickel, copper, and alloys thereof.

The first semiconductor chip 132 may include a central processing unit (CPU) or a graphics processing unit (GPU).

The through silicon via (TSV) 133 is disposed between (e.g., disposed directly therebetween) the lower bonding pad 134 and the upper bonding pad 135. The through silicon via (TSV) 133 electrically couples the lower bonding pad 134 and the upper bonding pad 135 to each other. In an embodiment, the through silicon via (TSV) 133 may include at least one compound selected from tungsten, aluminum, copper, and alloys thereof. In an embodiment, a barrier layer may be formed between the through silicon via (TSV) 133 and the insulating material of the substrate 110. In an embodiment, the barrier layer may include at least one compound selected from titanium, tantalum, a titanium nitride, a tantalum nitride, and alloys thereof.

As the second semiconductor chip die 140 is spaced apart from the substrate 110 for transmitting signals and power in the 3D integrated circuit structure 120, the through silicon via (TSV) 133 is disposed between the first semiconductor chips 132 of the first semiconductor chip die 130 and is connected to the second semiconductor chip die 140 to increase rates for receiving signals and power voltages of the second semiconductor chip die 140 and generating responses.

In an embodiment, the lower bonding pad 134 is disposed between (e.g., disposed directly therebetween) the through silicon via (TSV) 133 and the connecting member 131, and electrically couples the through silicon via (TSV) 133 and the connecting member 131 to each other. The upper bonding pad 135 is disposed between (e.g., disposed directly therebetween) the through silicon via (TSV) 133 and the connecting member 141. The upper bonding pad 135 electrically couples the through silicon via (TSV) 133 and the connecting member 141 of the second semiconductor chip die 140 to each other. In an embodiment, the lower bonding pad 134 and the upper bonding pad 135 may include at least one compound selected from copper, aluminum, silver, tin, gold, nickel, lead, titanium, and alloys thereof.

In an embodiment, the second semiconductor chip die 140 may include at least one second semiconductor chip, connecting members 141, and bonding pads 143. In an embodiment, the second semiconductor chip may include a sensor or a communication chip. The connecting member 141 electrically couples the second semiconductor chip die 140 and the first semiconductor chip die 130 to each other. In an embodiment, the connecting member 141 may include a micro bump. In an embodiment, the connecting member 141 may include at least one compound selected from tin, silver, lead, nickel, copper, and alloys thereof. The connecting member 141 is surrounded by the insulating member 142. The insulating member 142 is disposed between the first semiconductor chip die 130 and the second semiconductor chip die 140. In an embodiment, the insulating member 142 may include a non-conductive film (NCF).

The memory structure 150 is disposed on the substrate 110. In an embodiment, the memory structure 150 may include a single chip such as a DRAM or a multi-chip such as a high-bandwidth memory (HBM). The memory structure 150 may include a connecting member 151 and an insulation layer 152. The connecting member 151 electrically couples the memory structure 150 and the substrate 110 to each other. In an embodiment, the connecting member 151 may include a micro bump or solder ball. In an embodiment, the connecting member 151 may include at least one compound selected from tin, silver, lead, nickel, copper, and alloys thereof. The insulation layer 152 may include a plurality of openings for soldering. For example in an embodiment, the insulation layer 152 may include a solder resist. The insulation layer 152 prevents the connecting member 151 from being short-circuited.

The molding material 160 may mold the 3D integrated circuit structure 120 including the first semiconductor chip die 130 and the second semiconductor chip die 140, and the memory structure 150 on the substrate 110. In an embodiment, the molding material 160 may be made of a thermosetting resin such as an epoxy resin. However, embodiments of the present disclosure are not necessarily limited thereto. For example, in an embodiment, the molding material 160 may be an epoxy molding compound (EMC).

Figure 2:
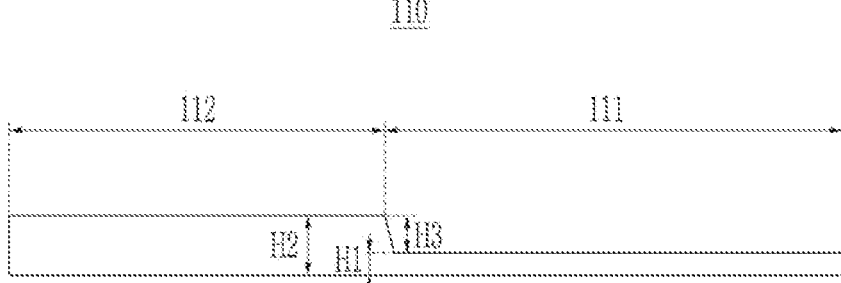
FIG. 2 shows a cross-sectional view of a first region and a second region on a substrate according to an embodiment of the present disclosure.

FIG. 2 shows a cross-sectional view of a first region 111 and a second region 112 on the substrate 110. The first region 111 and the second region 112 are spaced apart from each other (e.g., exclusive of each other).

In comparison to a package on package (PoP), the semiconductor package in which the 3D integrated circuit structure 120 and the memory structure 150 are disposed side by side on the substrate 110 may have an excellent dissipation characteristic and may omit a process for forming a back side redistribution structure, thereby reducing a turn-around time (TAT) used in manufacturing the semiconductor package. However, as the package size increases, warpage may increase. However, in an embodiment, the first region 111 of the substrate 110 is made relatively thin in the perpendicular direction with respect to the second region 112 of the substrate 110 to reduce the warpage characteristic.

For example, when the recess with a depth of 200 um is formed at a position of the substrate on which the 3D integrated circuit structure 120 is mounted and the warpage characteristic is tested, the warpage value is reduced by about 43% at the room temperature. In an embodiment, a thickness H1 of the first region 111 in the perpendicular direction (e.g., a vertical thickness) may be in a range of about 115 um to about 135 um. For example, the thickness H1 of the first region 111 in the perpendicular direction may be about 125 um. In an embodiment, a thickness H2 of the second region 112 in the perpendicular direction (e.g., a vertical thickness) may be in a range of about 315 um to about 335 um. For example, the thickness H2 of the second region 112 in the perpendicular direction may be about 325 um. In an embodiment, a thickness difference H3 between the second region 112 and the first region 111 in the perpendicular direction (e.g., a vertical thickness) may be in a range of about 180 um to about 220 um. For example, a thickness difference H3 between the second region 112 and the first region 111 in the perpendicular direction may be about 200 um. In an embodiment, a width of the first region 111 in the horizontal direction may be in a range of about 11 mm to about 15 mm. For example, a width of the first region 111 in the horizontal direction may be about 13 mm.

Figure 3:
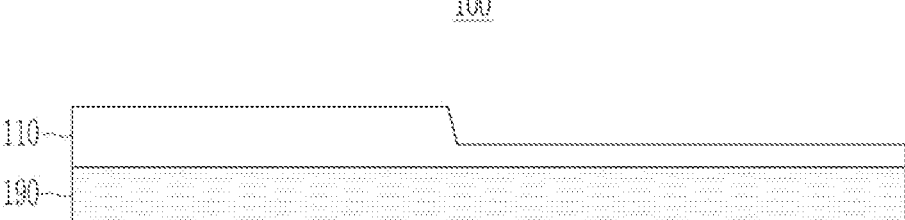
FIG. 3 shows a cross-sectional view of attaching a substrate on a carrier in which a recess is formed as one of steps of a method for manufacturing a semiconductor package.

FIG. 3 shows a cross-sectional view of attaching a substrate 110 on a carrier 190 in which a recess is formed in the substrate 110 as one of the steps of a method for manufacturing a semiconductor package. FIG. 3 to FIG. 9 show a method for manufacturing a semiconductor package of FIG. 1. According to the method for manufacturing a semiconductor package of embodiments shown in FIG. 3 to FIG. 9, the 3D integrated circuit structure 120 is manufactured in a process for manufacturing a semiconductor package so that there is no need to perform a separate process for manufacturing the 3D integrated circuit structure 120.

Referring to FIG. 3, the substrate 110 including the recess of FIG. 2 is attached on the carrier 190. In an embodiment, the carrier 190 may, for example, include a silicon-based material such as glass or a silicon oxide, an organic material, other materials such as an aluminum oxide, and arbitrary combinations of the materials.

Figure 4:
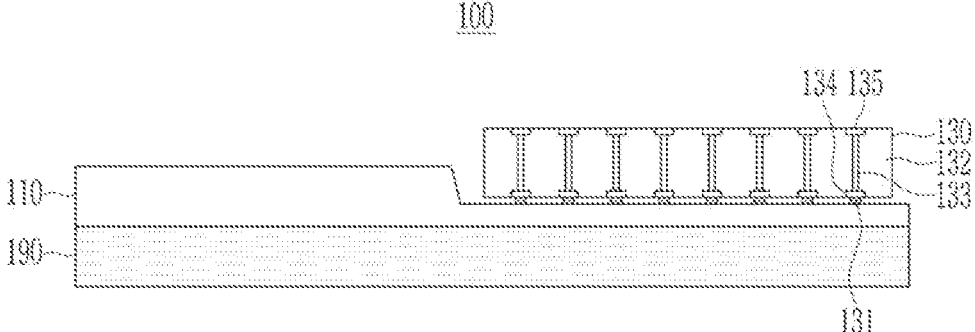

FIG. 4 shows a cross-sectional view of mounting a first semiconductor chip die 130 on a recess of a substrate 110 as one of the steps of a method for manufacturing a semiconductor package.

Referring to FIG. 4, the first semiconductor chip die 130 is mounted on the first region 111 of the substrate 110. For example, the substrate 110 and the lower bonding pad 134 of the first semiconductor chip die 130 are bonded together by the connecting member 131, and are electrically coupled to each other. As shown in FIG. 4, a level of an uppermost surface of the second region 112 is between levels of a lowermost surface of the first semiconductor chip die 130 and an uppermost surface of the first semiconductor chip die 130.

Figure 5:
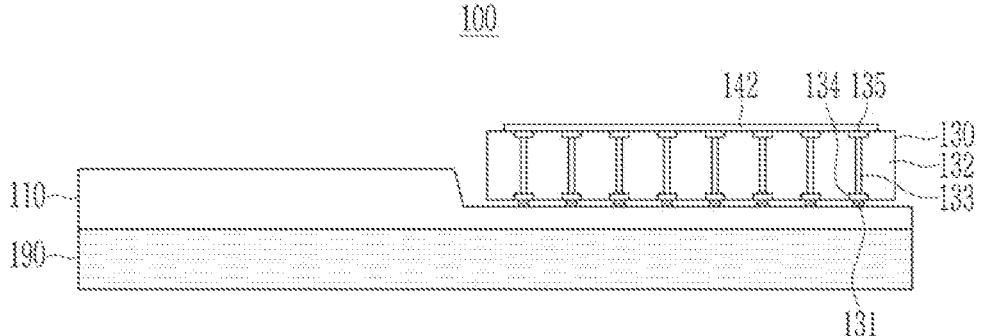

FIG. 5 shows a cross-sectional view of attaching an insulating member 142 on a first semiconductor chip die 130 as one of the steps of a method for manufacturing a semiconductor package.

Referring to FIG. 5, the insulating member 142 is attached on the first semiconductor chip die 130, such as an upper surface of the first semiconductor chip die 130. In an embodiment, the insulating member 142 may include a non-conductive film (NCF). The non-conductive film (NCF) is viscous and is attached to the first semiconductor chip die 130. In an embodiment, the non-conductive film (NCF) has an incurable state to be transformable by an external force. For example, in an embodiment the non-conductive film (NCF) may be heated at the temperature of about 170° C. to about 300° C. for about 1 second to about 20 seconds and may be attached to the first semiconductor chip die 130.

Figure 6:
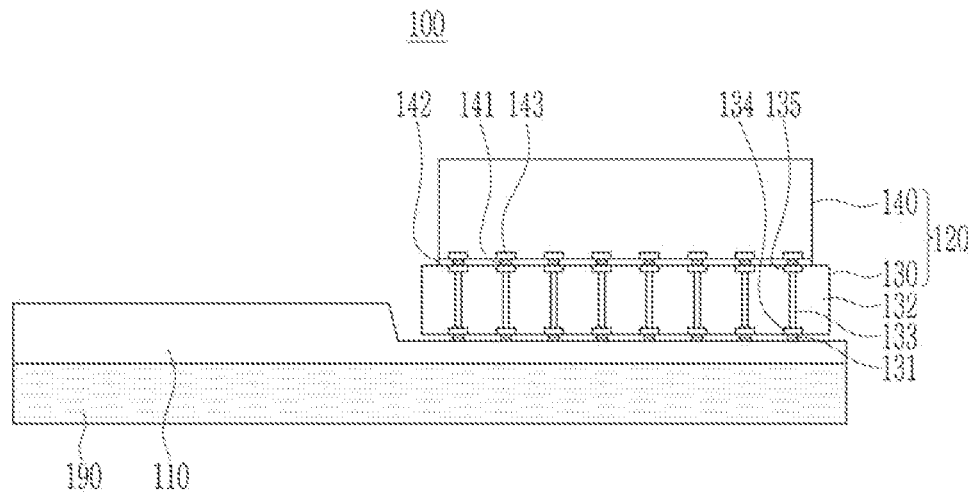

FIG. 6 shows a cross-sectional view of mounting a second semiconductor chip die 140 on a first semiconductor chip die 130 through an insulating member 142 as one of the steps of a method for manufacturing a semiconductor package.

Referring to FIG. 6, the second semiconductor chip die 140 is bonded on the first semiconductor chip die 130. In an embodiment, the bonding pad 143 of the second semiconductor chip die 140 and the upper bonding pad 135 of the first semiconductor chip die 130 may be bonded by the connecting member 141. In an embodiment, the connecting member 141 may include a micro bump. The connecting member 131 of the second semiconductor chip die 140 may pass through the insulating member 142 and may directly contact the first semiconductor chip die 130. As described above, the insulating member 142 is disposed between the first semiconductor chip die 130 and the second semiconductor chip die 140 to thus alleviate a stress between the first semiconductor chip die 130 and the second semiconductor chip die 140.

Figure 7:
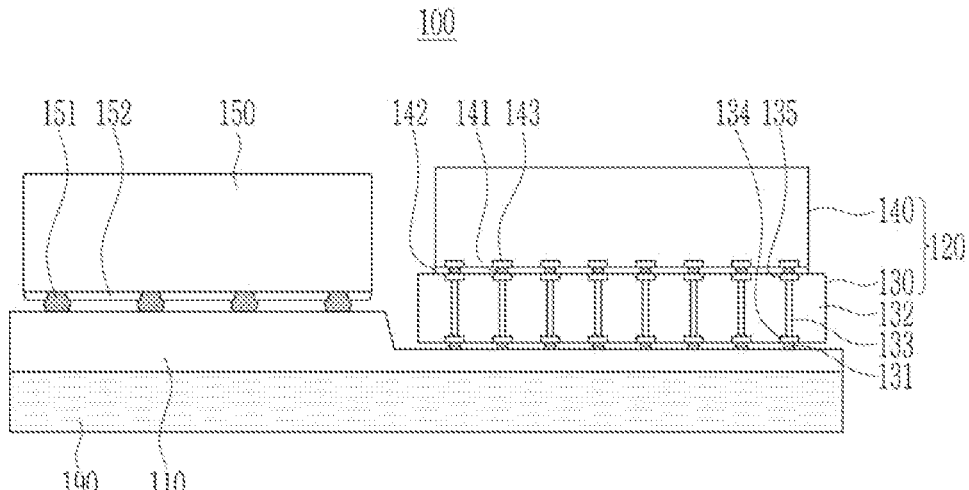

FIG. 7 shows a cross-sectional view of mounting a memory structure 150 on a substrate 110 as one of the steps of a method for manufacturing a semiconductor package.

Referring to FIG. 7, the memory structure 150 is mounted in the second region 112 of the substrate 110. For example, the substrate 110 and the memory structure 150 are bonded to each other by the connecting member 151, and are electrically coupled to each other.

Figure 8:
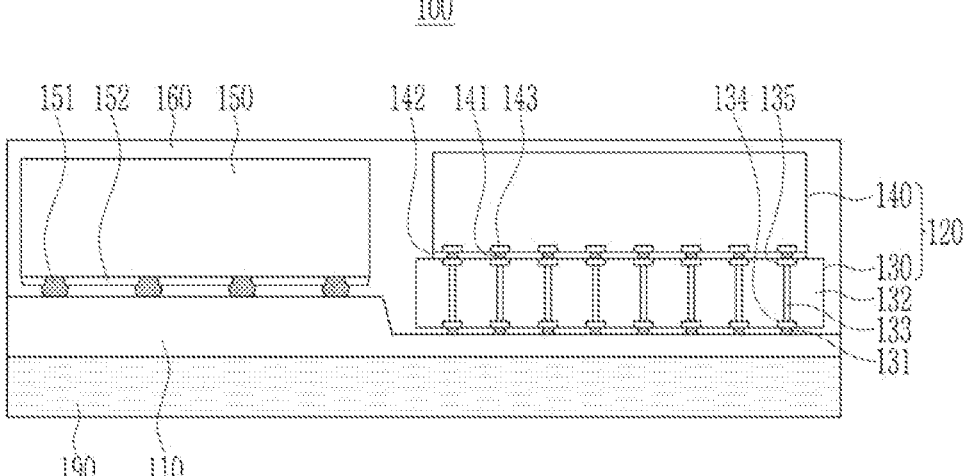

FIG. 8 shows a cross-sectional view of molding a 3D integrated circuit structure 120 and a memory structure 150 on a substrate 110 as one of the steps of a method for manufacturing a semiconductor package.

Referring to FIG. 8, the 3D integrated circuit structure 120 and the memory structure 150 are molded on the substrate 110 by using the molding material 160. In an embodiment, the molding process by use of the molding material 160 may include a compression molding or transfer molding process.

Figure 9:
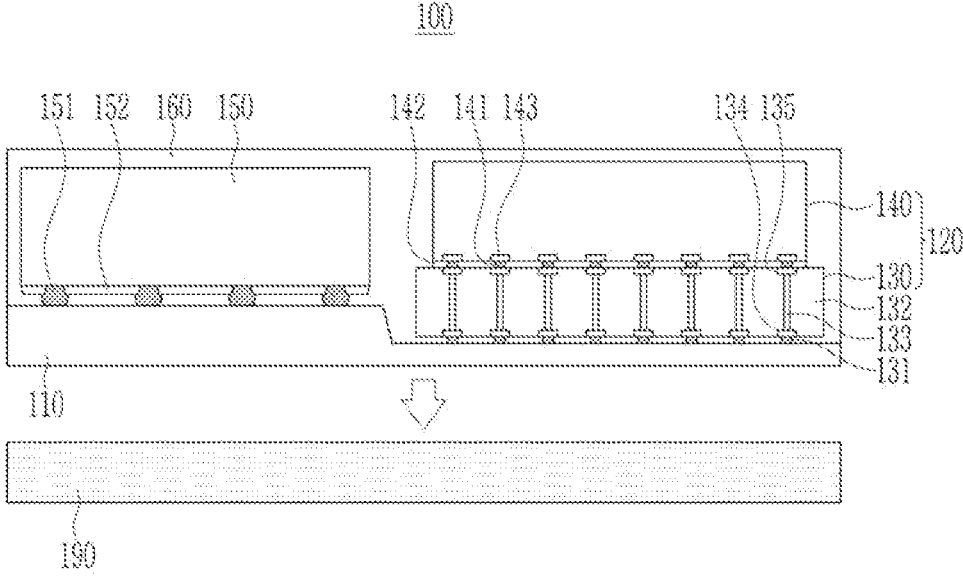

FIG. 9 shows a cross-sectional view of debonding the carrier 190 from a substrate 110 as one of the steps of a method for manufacturing a semiconductor package.

Referring to FIG. 9, the carrier 190 is debonded from the substrate 110.

As shown in FIG. 1, external connecting members 113, metal pads 114, and the insulation layer 115 may then be formed on the bottom surface of the substrate 110.

Figure 10:
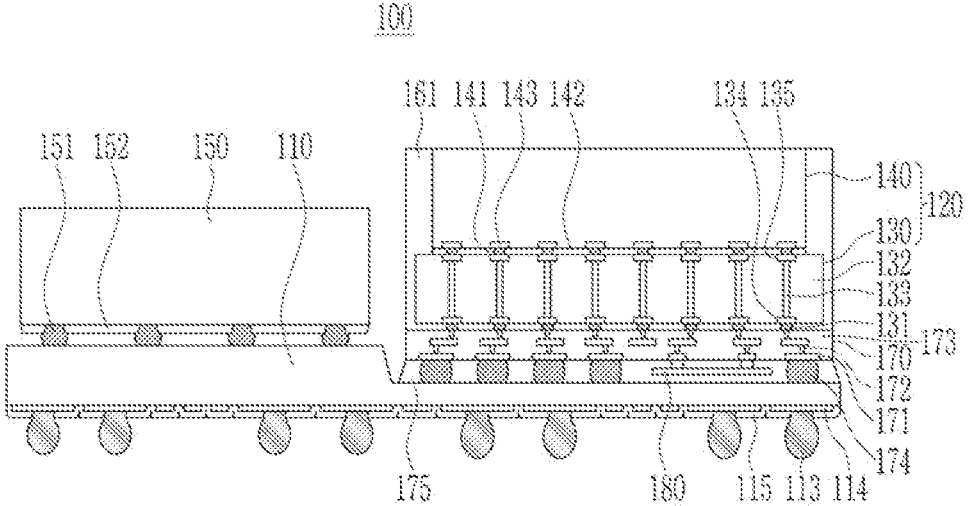
FIG. 10 shows a cross-sectional view of a semiconductor package including a package including a 3D integrated circuit structure disposed on a recess of a substrate, and a memory structure disposed side by side with the package including a 3D integrated circuit structure according to an embodiment of the present disclosure.

FIG. 10 shows a cross-sectional view of a semiconductor package including a package including a 3D integrated circuit structure 120 disposed on a recess of a substrate 110, and a memory structure 150 disposed side by side with the package including a 3D integrated circuit structure 120.

As a difference between FIG. 10 and FIG. 1, FIG. 10 the 3D integrated circuit structure 120 is mounted on the front side redistribution structure 170, the 3D integrated circuit structure 120 is molded on the front side redistribution structure 170, and the package including the 3D integrated circuit structure 120 and the memory structure 150 are not molded.

Referring to FIG. 10, the semiconductor package 100 may include a substrate 110, a package including a 3D integrated circuit structure 120, and a memory structure 150. The content described with reference to embodiments of FIG. 1 and FIG. 2 may be equivalently applied to the substrate 110 and the memory structure 150.

The package including a 3D integrated circuit structure 120 may include a front side redistribution structure 170, a first semiconductor chip die 130, a second semiconductor chip die 140, and a molding material 161.

In an embodiment, the front side redistribution structure 170 may include redistribution lines 171, redistribution vias 172, and a dielectric layer 173. However, embodiments of the present disclosure are not necessarily limited to front side redistribution structure 170 shown in FIG. 10 and the redistribution structure may include a greater/lesser number of the redistribution lines and the redistribution vias.

The redistribution lines 171 are disposed between the redistribution via 172 and the connecting member 174, and between the redistribution vias 172. The redistribution lines 171 electrically couple the redistribution vias 172, the connecting members 174, and the redistribution vias 172 in the horizontal direction.

The redistribution vias 172 are disposed between the redistribution lines 171 (e.g., in a thickness direction of the substrate 110), and between the redistribution line 171 and the connecting member 131 (e.g., in a thickness direction of the substrate 110). The redistribution vias 172 electrically couple the redistribution lines 171, the redistribution lines 171, and the connecting members 131 in the perpendicular direction. In an embodiment, the redistribution lines 171 and the redistribution vias 172 may include at least one compound selected from copper, aluminum, tungsten, nickel, gold, tin, titanium, and alloys thereof.

The dielectric layer 173 may include a photosensitive polymer layer. The photosensitive polymer is used to make a fine pattern by applying a photolithography process. In an embodiment, the dielectric layer 173 may include a photoimageable dielectric (PID) used for the redistribution process. For example, the photoimageable dielectric (PID) may include a polyimide-based photosensitive polymer, a novolak-based photosensitive polymer, a polybenzoxazole, a silicone-based polymer, an acrylate-based polymer, or an epoxy-based polymer.

The connecting members 174, the at least one passive element 180, and the insulating member 175 may be disposed on the bottom surface of the front side redistribution structure 170. The connecting member 174 electrically couples the front side redistribution structure 170 and the substrate 110 to each other. In an embodiment, the connecting member 174 may include a micro bump or a solder ball. For example, the connecting member 174 may include at least one compound selected from tin, silver, lead, nickel, copper, and alloys thereof. The passive element 180 may be a surface-mount device (SMD). For example, in an embodiment the passive element 180 may be a capacitor or a resistor. The insulating member 175 may surround the connecting members 174 and at least one passive element 180. In an embodiment, the insulating member 175 may include a molded under-fill (MUF).

The content described with reference to FIG. 1 may be equivalently applied to the first semiconductor chip die 130 and the second semiconductor chip die 140.

The molding material 161 may mold the 3D integrated circuit structure 120 including the first semiconductor chip die 130 and the second semiconductor chip die 140 on the front side redistribution structure 170. In an embodiment, the molding material 161 may be made of a thermosetting resin such as an epoxy resin. However, embodiments of the present disclosure are not necessarily limited thereto. For example, in an embodiment, the molding material 161 may be an epoxy molding compound (EMC).

Figure 11:
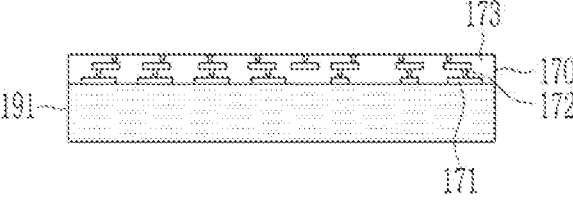
FIG. 11 shows a cross-sectional view of forming a front side redistribution structure on a carrier as one of steps of a method for manufacturing a package including a 3D integrated circuit structure.

FIG. 11 shows a cross-sectional view of forming a front side redistribution structure 170 on a carrier 191 as one of the steps of a method for manufacturing a package including a 3D integrated circuit structure 120. FIG. 11 to FIG. 22 show a method for manufacturing a semiconductor package of FIG. 10.

Referring to FIG. 11, a front side redistribution structure 170 is formed on (e.g., formed directly thereon) the carrier 191. In an embodiment, the carrier 190 may, for example, include a silicon-based material such as glass or a silicon oxide, an organic material, other materials such as an aluminum oxide, and arbitrary combinations of the materials.

A dielectric layer 173 is formed on (e.g., formed directly thereon) the carrier 191. In an embodiment, the dielectric layer 173 may be formed by a CVD, ALD, or PECVD process.

The dielectric layer 173 may be selectively etched to form openings, and conductive materials are filled in the openings to form redistribution lines 171. A dielectric layer 173 is additionally deposited on the redistribution lines 171 and the dielectric layer 173. The additionally deposited dielectric layer 173 is selectively etched to form via holes, and the via holes are filled with a conductive material to form redistribution vias 172. In an embodiment, the redistribution lines 171, the redistribution vias 172, and the dielectric layer 173 are formed by repeatedly performing the above-noted process.

In an embodiment, the redistribution lines 171 and the redistribution vias 172 may be formed by performing a sputtering process. However, embodiments of the present disclosure are not necessarily limited thereto. For example, in an embodiment, the redistribution lines 171 and the redistribution vias 172 may be formed by forming a seed metal layer and then performing an electroplating process.

Figure 12:
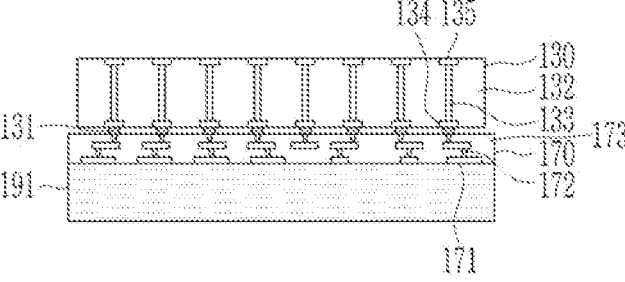

FIG. 12 shows a cross-sectional view of the bonding of a first semiconductor chip die 130 to a front side redistribution structure 170 as one of the steps of a method for manufacturing a package including a 3D integrated circuit structure 120.

Referring to FIG. 12, the connecting member 131 of the first semiconductor chip die 130 is bonded to the front side redistribution structure 170, and they are electrically coupled to each other.

Figure 13:
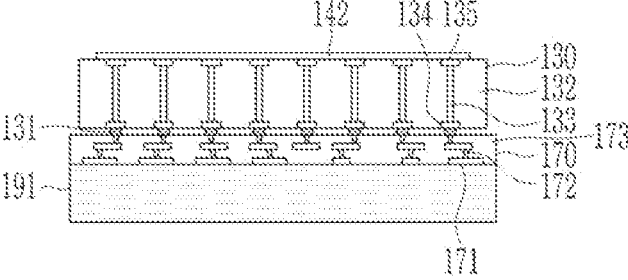

FIG. 13 shows a cross-sectional view of attaching an insulating member 142 on (e.g., directly on) a first semiconductor chip die 130 as one of the steps of a method for manufacturing a package including a 3D integrated circuit structure 120.

Referring to FIG. 13, the insulating member 142 is attached to the first semiconductor chip die 130. In an embodiment, the insulating member 142 may include a non-conductive film (NCF). The non-conductive film (NCF) is viscous and is attached to the first semiconductor chip die 130. In an embodiment, the non-conductive film (NCF) has an incurable state to be transformable by an external force. For example, in an embodiment the non-conductive film (NCF) may be heated at the temperature of about 170° C. to about 300° C. for about 1 second to about 20 seconds and may be attached to the first semiconductor chip die 130.

Figure 14:
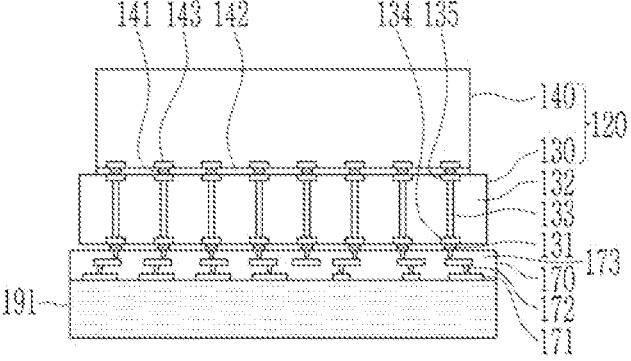

FIG. 14 shows a cross-sectional view of bonding a second semiconductor chip die 140 on a first semiconductor chip die 130 through an insulating member 142 as one of the steps of a method for manufacturing a package including a 3D integrated circuit structure 120.

Referring to FIG. 14, the second semiconductor chip die 140 is bonded on the first semiconductor chip die 130. The bonding pad 143 of the second semiconductor chip die 140 and the upper bonding pad 135 of the first semiconductor chip die 130 may be bonded to each other by the connecting member 141. In an embodiment, the connecting member 141 may include a micro bump. The connecting member 131 of the second semiconductor chip die 140 may pass through the insulating member 142 and may directly contact the first semiconductor chip die 130. As described above, the stress between the first semiconductor chip die 130 and the second semiconductor chip die 140 may be reduced by disposing the insulating member 142 between the first semiconductor chip die 130 and the second semiconductor chip die 140.

Figure 15:
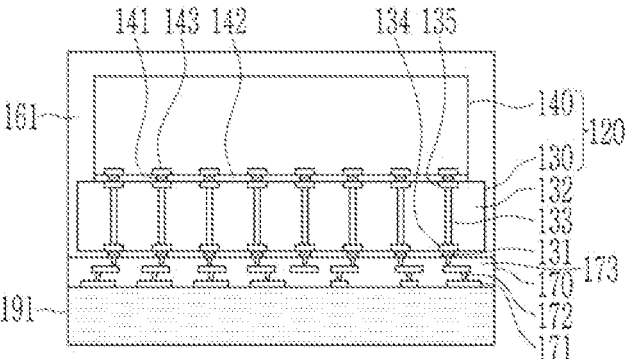

FIG. 15 shows a cross-sectional view of molding a 3D integrated circuit structure 120 on a front side redistribution structure 170 as one of the steps of a method for manufacturing a package including a 3D integrated circuit structure 120.

Referring to FIG. 15, the 3D integrated circuit structure 120 is molded on the front side redistribution structure 170 by use of the molding material 161. In an embodiment, the molding process with the molding material 161 may include a compression molding or a transfer molding process.

Figure 16:
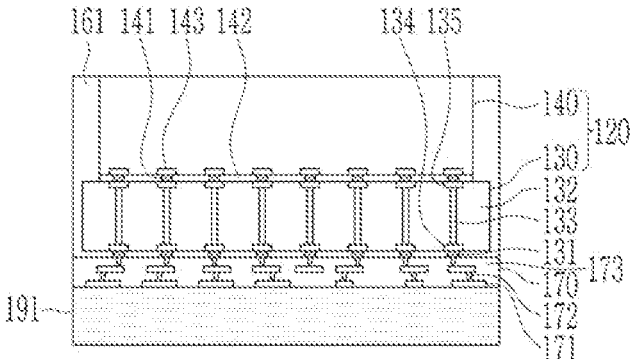

FIG. 16 shows a cross-sectional view of planarizing an upper surface of a package including a 3D integrated circuit structure 120 as one of the steps of a method for manufacturing a package including a 3D integrated circuit structure 120.

Referring to FIG. 16, in an embodiment the upper surface of the package including the 3D integrated circuit structure 120 is planarized by applying a chemical mechanical polishing (CMP) process or a mechanical grinding process.

Figure 17:
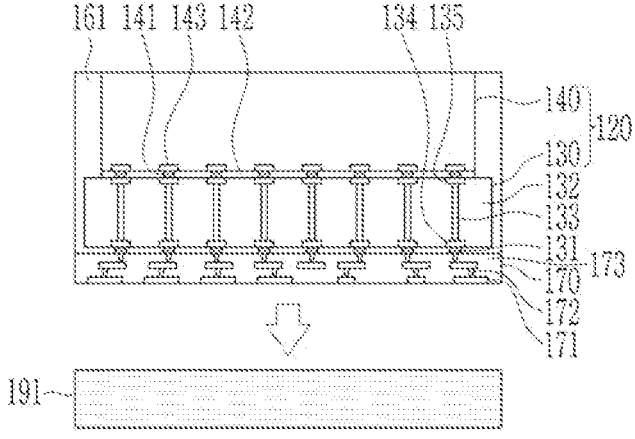

FIG. 17 shows a cross-sectional view of debonding a carrier 191 as one of the steps of a method for manufacturing a package including a 3D integrated circuit structure 120.

Referring to FIG. 17, the carrier 191 is debonded from the bottom surface of the front side redistribution structure 170.

Figure 18:
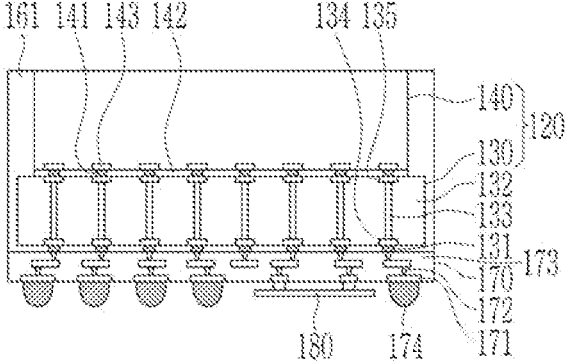

FIG. 18 shows a cross-sectional view of attaching an external connecting member 174 and a passive element 180 to a bottom surface of a package including a 3D integrated circuit structure 120 as one of the steps of a method for manufacturing a package including a 3D integrated circuit structure 120.

Referring to FIG. 18, the connecting member 174 and the passive element 180 are attached to the bottom surface of the package including the 3D integrated circuit structure 120.

Figure 19:
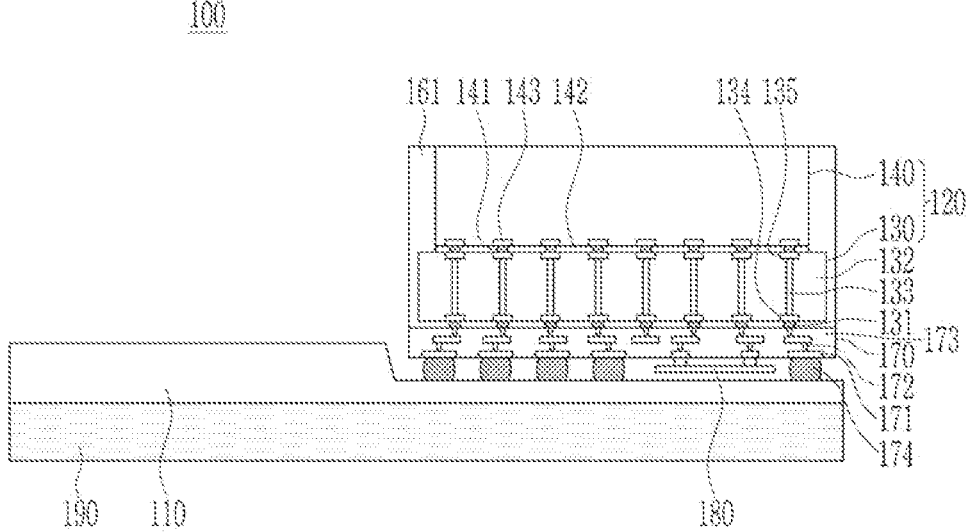

FIG. 19 shows a cross-sectional view of mounting a package including a 3D integrated circuit structure 120 on a recess of a substrate 110 as one of the steps of a method for manufacturing a semiconductor package.

Referring to FIG. 19, the package including the 3D integrated circuit structure 120 is mounted on the first region 111 of the substrate 110 that is attached to the carrier 190. For example, the substrate 110 and the front side redistribution structure 170 are bonded to each other by the connecting member 174, and are electrically coupled to each other. In an embodiment, the carrier 190 may include a silicon-based material such as glass or a silicon oxide, an organic material, other materials such as an aluminum oxide, and arbitrary combinations of the materials.

Figure 20:
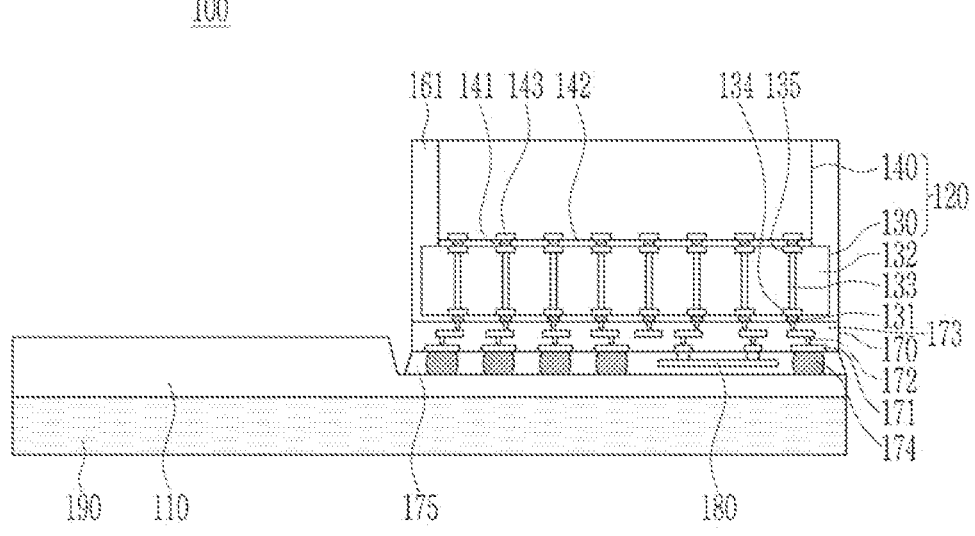

FIG. 20 shows a cross-sectional view of filling a connecting member 174 and a passive element 180 of a package including a 3D integrated circuit structure 120 by use of an insulating member 175 as one of the steps of a method for manufacturing a semiconductor package.

Referring to FIG. 20, the substrate 110 and the front side redistribution structure 170 are bonded to each other by the connecting member 174. A space between the package including the 3D integrated circuit structure 120 and the first region 111 of the substrate 110 may be filled with the insulating member 175. The insulating member 175 surrounds the connecting member 174 and the passive element 180 and fills spaces therebetween. In an embodiment, the insulating member 175 may include the MUF.

Figure 21:
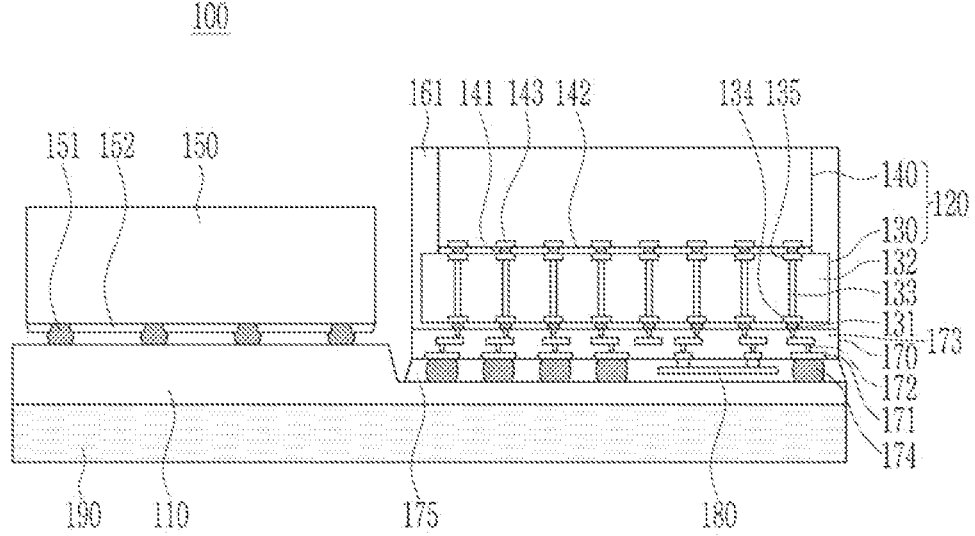

FIG. 21 shows a cross-sectional view of mounting a memory structure 150 on a substrate 110 as one of the steps of a method for manufacturing a semiconductor package.

Referring to FIG. 21, the memory structure 150 is mounted on the second region 112 of the substrate 110. For example, the substrate 110 and the memory structure 150 are bonded by the connecting member 151, and are electrically coupled to each other.

Figure 22:
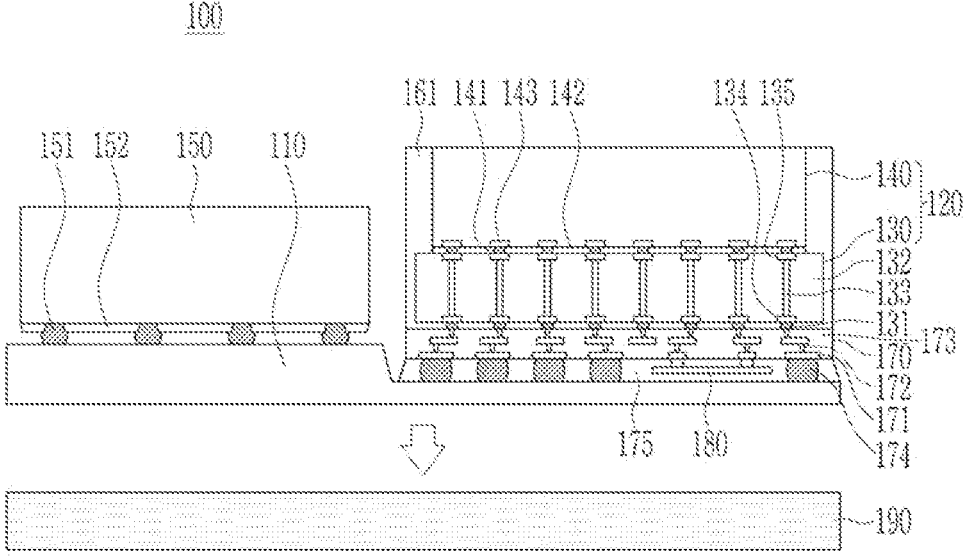

FIG. 22 shows a cross-sectional view of debonding a carrier 190 as one of the steps of a method for manufacturing a semiconductor package.

Referring to FIG. 22, the carrier 190 is debonded from the substrate 110.

As shown in FIG. 10, external connecting members 113, metal pads 114 and insulation layers 115 may be formed on the bottom surface of the substrate 110.

While the present disclosure has been described in connection with embodiments thereof, it is to be understood that embodiments of the present disclosure are not necessarily limited to the described embodiments, but, on the contrary, is intended to cover various modifications and equivalent arrangements included within the spirit and scope of the present disclosure.

What is claimed is:

1. A semiconductor package comprising:
a substrate including a first region defined as a recess in the substrate and a second region other than the first region;
a three-dimensional (3D) integrated circuit structure disposed on the first region to be non-overlapping vertically with the second region, the 3D integrated circuit structure including a first semiconductor chip die and a second semiconductor chip die disposed on the first semiconductor chip die;
a plurality of connecting members electrically connecting the first semiconductor chip die to the substrate, wherein a first side of each connecting member of the plurality of connecting members directly contacts the first semiconductor chip die and a second side that is opposite to the first side directly contacts the first region; and
a memory structure disposed on the second region to be non-overlapping vertically with the first region and positioned side by side with the 3D integrated circuit structure.

2. The semiconductor package of claim 1, wherein:
a difference between a vertical thickness of the second region and a vertical thickness of the first region is in a range of about 180 μm to about 220 μm.

3. The semiconductor package of claim 1, wherein:
a vertical thickness of the first region is in a range of about 115 μm to about 135 μm.

4. The semiconductor package of claim 1, wherein:
a vertical thickness of the second region is in a range of about 315 μm to about 335 μm.

5. The semiconductor package of claim 1, wherein
a level of an uppermost surface of the second region is between levels of a lowermost surface of the first semiconductor chip die and an uppermost surface of the first semiconductor chip die.

6. The semiconductor package of claim 1, wherein:
the second semiconductor chip die includes a communication chip or a sensor.

7. The semiconductor package of claim 1, wherein:
the first semiconductor chip die includes a central processing unit (CPU) or graphics processing unit (GPU).

8. The semiconductor package of claim 1, wherein:
the first semiconductor chip die includes a plurality of through silicon vias.

9. The semiconductor package of claim 1, wherein:
the 3D integrated circuit structure includes a system on chip (SOC).

10. The semiconductor package of claim 1, wherein:
the memory structure includes a high-bandwidth memory (HBM).

11. A semiconductor package comprising:
a substrate including a first region defined as a recess in the substrate and a second region other than the first region;
a redistribution structure disposed on the first region to be non-overlapping vertically with the second region;
a three-dimensional (3D) integrated circuit structure disposed on the redistribution structure to be non-overlapping vertically with the second region, the 3D integrated circuit structure including a first semiconductor chip die and a second semiconductor chip die disposed on the first semiconductor chip die; and
a memory structure disposed on the second region to be non-overlapping vertically with the first region and positioned side by side with the 3D integrated circuit structure.

12. The semiconductor package of claim 11, further comprising:
a molding material on the redistribution structure, the molding material molding the 3D integrated circuit structure.

13. The semiconductor package of claim 11, further comprising:
a plurality of connecting members disposed between the redistribution structure and the first region of the substrate, and
at least one capacitor structure on a bottom surface of the redistribution structure.

14. The semiconductor package of claim 13, further comprising:
an insulating member surrounding the plurality of connecting members and the at least one capacitor structure between the first region of the substrate and the redistribution structure.

15. The semiconductor package of claim 14, wherein:
the insulating member includes a molded under-fill (MUF).

16. A semiconductor package comprising:
a substrate including a first region defined as a recess in the substrate and a second region other than the first region;

a three-dimensional (3D) integrated circuit structure disposed on the first region to be non-overlapping vertically with the second region, the 3D integrated circuit structure including:

a first semiconductor chip die;

a second semiconductor chip die disposed on the first semiconductor chip die;

a plurality of first connecting members disposed between the first semiconductor chip die and the second semiconductor chip die, the plurality of first connecting members electrically connecting the first semiconductor chip die to the second semiconductor chip die;

an insulating member surrounding the plurality of first connecting members between the first semiconductor chip die and the second semiconductor chip die;

a plurality of second connecting members, wherein a first side of each second connecting member of the plurality of second connecting members directly contacts the first semiconductor chip die and a second side opposite to the first side directly contacts the first region;

a memory structure disposed on the second region to be non-overlapping vertically with the first region and positioned side by side with the 3D integrated circuit structure; and a molding material molding the 3D integrated circuit structure and the memory structure.

17. The semiconductor package of claim 16, wherein:

each first connecting member of the plurality of first connecting members include a micro bump.

18. The semiconductor package of claim 16, wherein:

the plurality of second connecting members includes a micro bump.

19. The semiconductor package of claim 16, wherein:

the insulating member includes a non-conductive film (NCF).

20. The semiconductor package of claim 16, wherein:

the molding material includes an epoxy molding compound (EMC).

* * * * *